United States Patent

Fei et al.

[11] Patent Number: 6,097,640
[45] Date of Patent: Aug. 1, 2000

[54] MEMORY AND CIRCUIT FOR ACCESSING DATA BITS IN A MEMORY ARRAY IN MULTI-DATA RATE OPERATION

[75] Inventors: Kamin Fei, Sunnyvale; Hua Zheng, Fremont; Teng Su, Sunnyvale, all of Calif.

[73] Assignee: Winbond Electronics Corporation, Hsinchu, Taiwan, China

[21] Appl. No.: 09/195,743

[22] Filed: Nov. 18, 1998

Related U.S. Application Data
[60] Provisional application No. 60/095,505, Aug. 5, 1998.

[51] Int. Cl.$^7$ ........................................................ G11C 7/00
[52] U.S. Cl. ........................................ 365/189.02; 365/205
[58] Field of Search ............................... 365/205, 230.04, 365/189.02, 230.02, 230.03

[56] References Cited

U.S. PATENT DOCUMENTS

| | | | |
|---|---|---|---|
| 5,497,347 | 3/1996 | Feng | 365/189.07 |
| 5,504,875 | 4/1996 | Mills et al. | 365/189.02 |
| 5,537,352 | 7/1996 | Meyer et al. | 365/189.02 |
| 5,748,561 | 5/1998 | Hotta | 365/238.5 |

*Primary Examiner*—Son Mai
*Attorney, Agent, or Firm*—Townsend & Townsend & Crew

[57] ABSTRACT

A method and circuit for accessing data bits in a memory array in a multi-data rate operation. In one architecture, a memory device includes a memory array for storing data values, multiple (N) sensing circuits, multiple (K) control lines, and an I/O pad. One sensing circuit couples to each data value being retrieved from the memory device. The I/O pad operatively couples to the sensing circuits. And each control line couples to at least one sensing circuit and has a clock phase unique from remaining control lines.

41 Claims, 7 Drawing Sheets

MEMORY AND CIRCUIT FOR ACCESSING DATA BITS IN A MEMORY ARRAY IN MULTI-DATA RATE OPERATION

This application claims the benefit of a U.S. provisional Application Ser. No. 60/095,505, filed Aug. 5, 1998 which is incorporated herein by reference. This application is further related to U.S. patent Application Ser. No. 09/195,269 entitled "MEMORY ARRAY ARCHITECTURE FOR MULTI-DATA RATE OPERATION," and U.S. patent application Ser. No. 09/195,268 "METHOD AND CIRCUIT FOR TRIGGERING COLUMN SELECT LINE FOR WRITE OPERATIONS," both are filed on the same day as the present application, assigned to the assignee of the present invention, and incorporated herein by reference.

BACKGROUND OF THE INVENTION

The present invention relates generally to memory devices, and more particularly to a method and circuit for accessing data bits in a memory array in multi-data rate operation.

Memory devices are integral to a computer system, and to many electronic circuits. Constant improvements in the operating speed and computing power of a central processing unit (CPU) enables operation of an ever-greater variety of applications, many of which require faster and larger memories. Larger memories can be obtained by shrinking the geometry of the memory cells and data lines within memory devices. However, with regard to memory speed, the access time for a memory device is generally governed by certain limitations. More particularly, memory speed is, to a large extent, dictated by the charge and discharge rates of parasitic capacitance on memory data lines.

Conventionally, a memory access to retrieve a data bit is performed by: (1) activating a row control line (e.g., a row select line or a word line) for the data bit; (2) waiting for the charge that is stored in a memory cell corresponding to the data bit to generate a voltage on a sense line; (3) sensing the charged voltage on the sense line to determine the value of the data bit; (4) activating a column select line; and (5) providing the detected bit value to a data line, and further to an input/output (I/O) pin of the memory device. A memory access to write a data bit is performed by: (1) activating the row control line for the required memory location; (2) receiving a write command and the associated data bit; (3) activating the column select line; and (4) providing the data bit to the memory cell. Conventionally, the steps for a memory read or a memory write are performed in sequential order for each accessed data bit.

The processes described above typically define the access time of a memory device (i.e., to retrieve or to write a data bit). The access time determines the maximum data transfer rate to or from a memory device. Traditionally, improvement in the access time of a memory read is limited to the time it takes to charge the sense line. Incremental improvements can be made to decrease the charge time by reducing the geometry of the device, thereby reducing the parasitic effects.

Large improvement in the data retrieval rate can be achieved by performing a concurrent pre-fetch of two data bits from memory and providing the retrieved bits on two data lines. In this manner, the memory device operates in a double data rate (DDR) operation. Large improvement in the data write rate can be achieved in a similar manner by (serially) receiving two data bits, aligning the data bits, and performing a concurrent double write to memory.

Conventionally, a concurrent read or write of two data bits requires additional circuitry, such as more internal data lines and sense amplifiers. The additional circuitry, while increasing the data transfer rate, results in larger die area and increased circuit cost. There is thus a need for methods and circuits that facilitate efficient access of data bits in a memory array in DDR operation.

SUMMARY OF THE INVENTION

The present invention provides a method and circuit for substantially accessing multiple data bits in a memory array in multi-data rate operation. The data bits are accessed by activating a word line corresponding to the selected row of the memory array and one or more column select lines corresponding to the selected columns. One common CSL can determine the memory addresses of all accessed data bits, which simplifies the design of the memory array. However, two or more CSLs can be used for additional flexibility. The timing of the CSL(s) can be staggered to allow efficient access of data bits to and from the memory array. The columns (i.e., the bit lines) of the memory array are designated to respective local I/O lines in a manner such that two or more columns within the memory array can be accessed substantially concurrently.

A specific embodiment of the invention provides a memory architecture that includes a memory array for storing data values, multiple (N) sensing circuits, multiple (K) control lines, and an I/O pad. The control line can be a common select line. One sensing circuit couples to each data value being retrieved from the memory array. The I/O pad operatively couples to the sensing circuits. Each control line couples to at least one sensing circuit. Each control line can further correspond to a clock phase that is unique from those of other control lines.

Another specific embodiment of the invention provides a memory architecture that includes a memory array for storing data values, multiple sensing circuits, multiple (N) switches, multiple (K) control lines, a column timing switch control circuit, and an I/O pad. One sensing circuit couples to each data value being retrieved from the memory array. One switch couples to each sensing circuit and to the column timing switch control circuit. The I/O pad operatively couples to the switches. Each control line couples to at least one sensing circuit.

Yet another specific embodiment of the invention provides a method for accessing data bits in a multi-data rate operation. The method includes: (1) selecting a plurality (N) of data bits to be accessed; (2) providing a plurality (K) of control lines; (3) sensing a selected subset of the data bits in accordance with each control line; and (4) providing the sensed data values to an I/O pad. Each control line has a clock phase that is unique from other control lines.

The foregoing, together with other aspects of this invention, will become more apparent when referring to the following specification, claims, and accompanying drawings.

DESCRIPTION OF THE SPECIFIC EMBODIMENTS

A double data rate (DDR) memory access performs a "prefetch" of two data bits of information from two different addresses for each device input/output (I/O) pin. DDR allows information to be transferred from the I/O pins at a faster rate than conventional single data rate (SDR).

Figure 1:
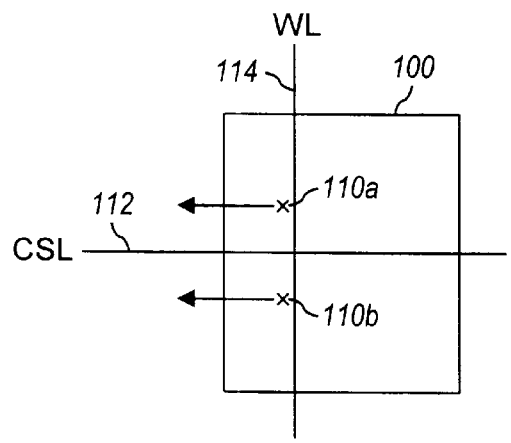
FIG. 1 shows a prefetch of two data bits from a memory array in a double data rate (DDR) operation.

FIG. 1 shows a prefetch of two data bits 110a and 110b from a memory array 100 in DDR operation. Data bits 110a and 110b are accessed by activating one or more column select lines (CSLs) 112 corresponding to the selected columns (only one CSL is shown in FIG. 1) and a word line (WL) 114 corresponding to the selected row of memory array 100. As shown in FIG. 1, a common CSL 112 determines the memory addresses of both accessed data bits, which simplifies the design of memory array 100. However, two CSLs can be used for additional flexibility. Data bits 110a and 110b are retrieved substantially concurrently from memory array 100 (i.e., within the same clock cycle of a system clock CLK). For DDR operation, the data bits are typically clocked out of the device I/O pins on both rising and falling clock edges.

Memory array 100 can be implemented within a dynamic random access memory (DRAM), a synchronous DRAM (SDRAM), a synchronous graphics RAM (SGRAM), or other types of memory device.

As used herein, an "accessed" data bit generally refers to either a data bit retrieved from the memory array during a read operation or a data bit written to the memory array during a write operation. Similarly, a "memory access" refers to either a memory read or a memory write operation.

Figure 2A:
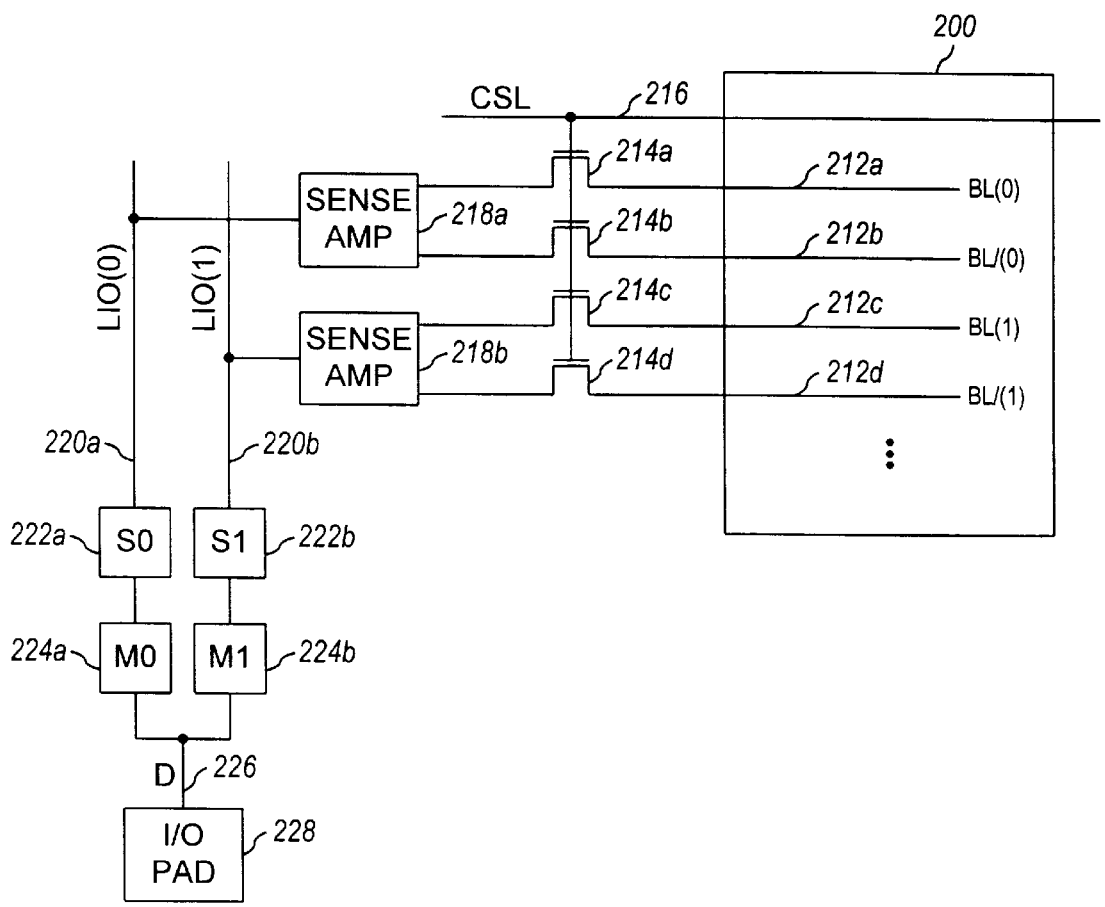
FIG. 2A shows an architecture wherein memory access of two data bits is enabled by a common column select line (CSL)

FIG. 2A shows an architecture wherein memory access of two data bits is enabled by a common CSL. Within a memory array 200, each data bit is accessed through a pair of complementary bit lines 212. For example, the first data bit is accessed through bit lines (BL(0)) 212a and (BL/(0)) 212b. Similarly, the second data bit is accessed through bit lines (BL(1)) 212c and (BL(1)) 212d. Bit lines 212a through 212d couple to column select transfer transistors 214a through 214d, respectively. As shown in FIG. 2A, transistors 214 are implemented with N-channel transistors. Transistors 214 are controlled by a common CSL 216. Transistors 214a and 214b couple bit lines 212a and 212b, respectively, to a sense amplifier 218a. Similarly, transistors 214c and 214d couple bit lines 212c and 212d, respectively, to a sense amplifier 218b. Sense amplifiers 218a and 218b detect the bit values and provide the detected values to local I/O lines (LIO(0)) 220a and (LIO(1)) 220b, respectively. Collectively, transistors 214a and 214b and sense amplifier 218a form one sensing circuit, and transistors 214c and 214d and sense amplifier 218b form a second sensing circuit. Memory array 200 typically includes many bit line pairs, the majority of which are not shown in FIG. 2A for clarity.

The values on local I/O lines 220a and 220b are provided to corresponding storage elements (S0) 222a and (S1) 222b. Storage elements 222 can be registers, latches, or other storage elements or buffer circuits. Storage elements 222a and 222b couple to multiplexers/demultiplexers (M0) 224a and (M1) 224b, respectively. Multiplexers 224 effectively act as switches that select the proper data bits (i.e., the proper bit order) to provide, through a data line (D) 226, to an I/O pad 228.

Figure 2B:
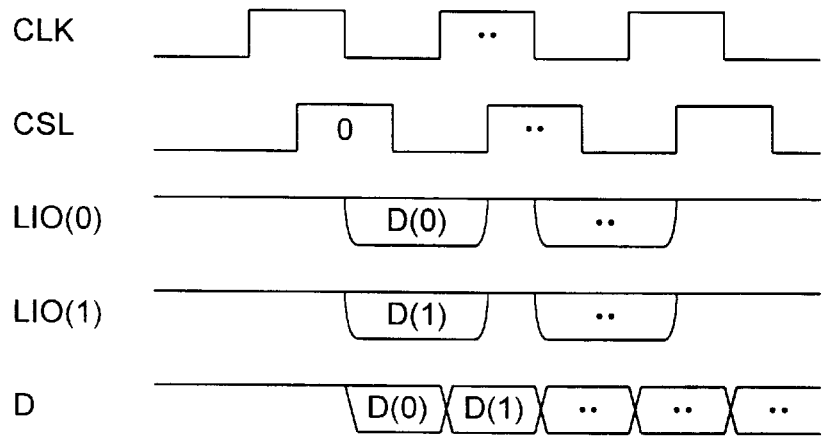
FIG. 2B shows a timing diagram for a read operation for the architecture shown in FIG. 2A.

FIG. 2B shows a timing diagram for a read operation for the architecture shown in FIG. 2A. As shown in FIG. 2B, the CSL signal is related to a system clock signal (CLK) and is skewed slightly relative to CLK. The data values D(0) and D(1) are provided (substantially concurrently) on local I/O lines 220a and 220b, respectively, a short time after the leading edge of the CSL signal. Multiplexers 224a and 224b multiplex the data values such that D(1) is delayed by half a clock cycle from D(0). The data values D(0) and D(1) are multiplexed and provided on data line 226. Subsequently, the data values D(0) and D(1) are clocked from I/O pad 228 at twice the rate of the CSL signal (i.e., on the rising and falling edges of the clock signal CLK).

Figure 2C:
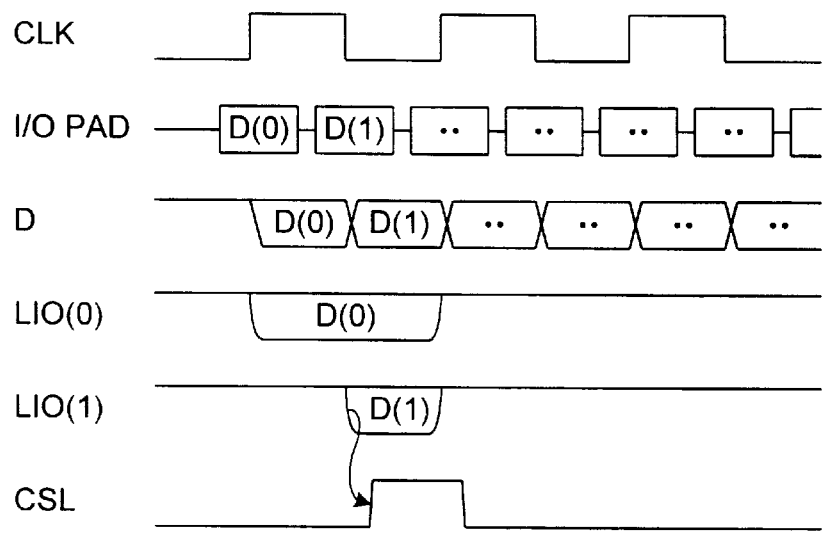
FIG. 2C shows a timing diagram for a write operation for the architecture shown in FIG. 2A.

FIG. 2C shows a timing diagram for a write operation for the architecture shown in FIG. 2A. As shown in FIG. 2C, the input data at I/O pad 228 is provide to data line 226 and through demultiplexers 224a and 224b onto local I/O lines 220a and 220b, respectively. Since the first input data bit D(0) is received a half clock cycle (using the clock signal CLK) earlier than the second input data bit D(1), the CSL is not activated until the second data bit D(1) becomes available. Meanwhile, the first data bit is stored temporarily for half a clock cycle.

Figure 2D:
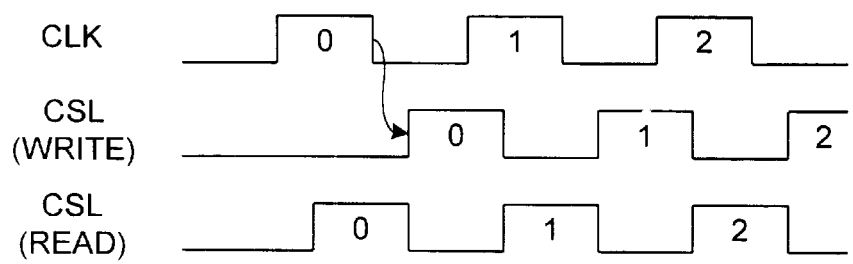
FIG. 2D shows a timing diagram of the CSL signals for the read and write operations for the architecture shown in FIG. 2A.

FIG. 2D shows a timing diagram of the CSL signals for the read and write operations. As illustrated in FIGS. 2B and 2C, the CSL signal is delayed for a half clock cycle during the write operation because of the need to wait for the second data bit to arrive before commencement of a concurrent write of both data bits to the memory array.

Figure 3A:
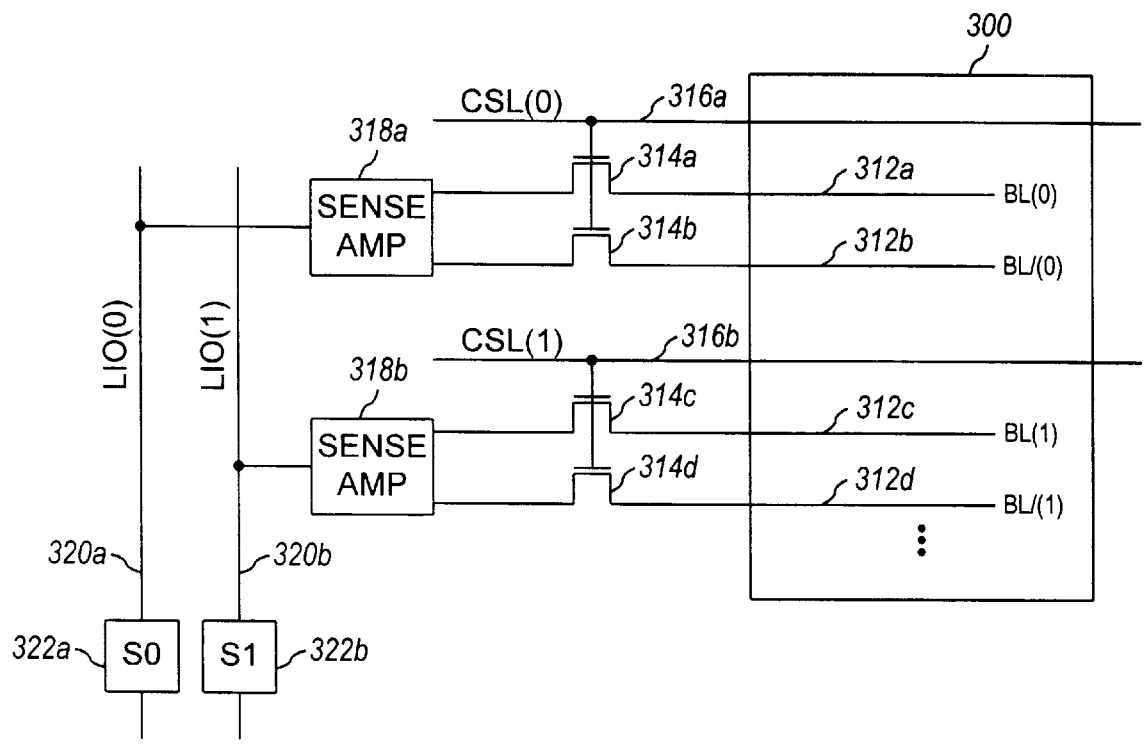
FIG. 3A shows an architecture wherein memory access of two data bits is enabled by two CSLs.

FIG. 3A shows an architecture wherein memory access of two data bits is enabled by two CSLs. Within a memory array 300, bit lines 312a through 312d couple to column select transfer transistors 314a through 314d, respectively. Transistors 314a and 314b are controlled by a first column select line (CSL(0)) 316a, and transistors 314c and 314d are controlled by a second column select line (CSL(1)) 316b. Transistors 314 couple the bit lines to corresponding sense amplifiers 318. Sense amplifiers 318a and 318b detect the bit values and provide the detected values to local I/O lines (LIO(0)) 320a and (LIO(1)) 320b, respectively. The values on local I/O lines 320a and 320b are provided to corresponding storage elements (S0) 322a and (S1) 322b.

Figure 3B:
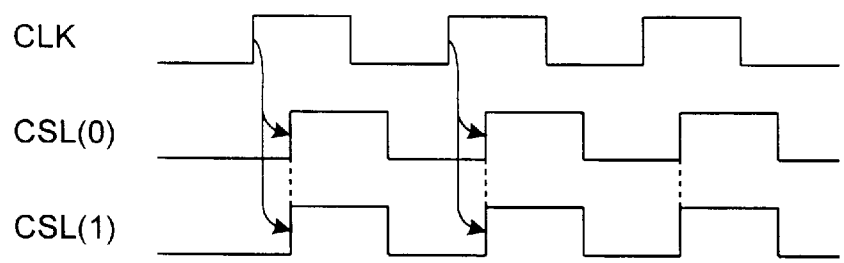
FIG. 3B shows a timing diagram of the CSL signals for the architecture shown in FIG. 3A.

FIG. 3B shows a timing diagram of the CSL signals for the two CSL architecture shown in FIG. 3A. As shown, the two CSLs have the same access timing derived from the clock signal (CLK).

Figure 4A:
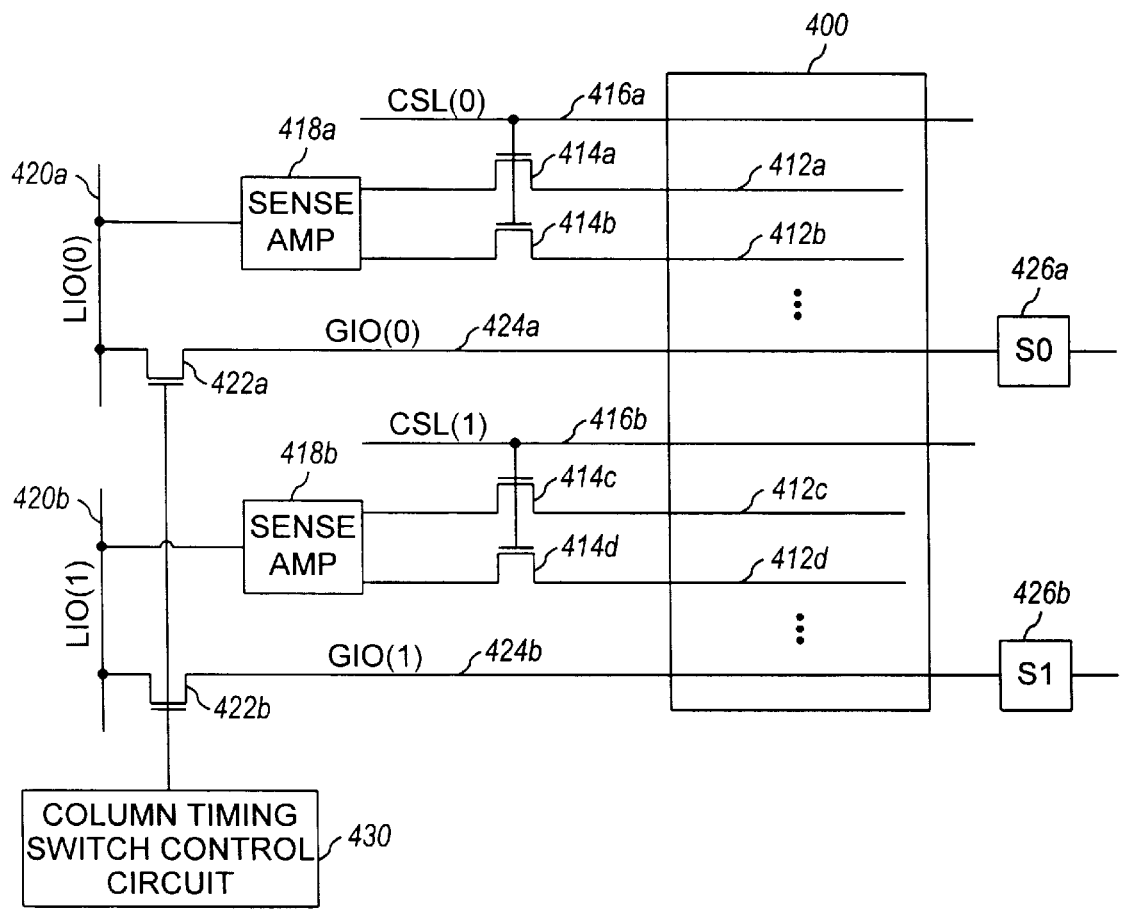
FIG. 4A shows an architecture wherein memory access of two data bits is enabled by two CSLs and using segmented local I/O lines.

FIG. 4A shows an architecture wherein memory access of two data bits is enabled by two CSLs and using segmented local I/O lines. Within a memory array 400, bit lines 412a through 412d couple to column select transfer transistors 414a through 414d, respectively. Transistors 414a and 414b are controlled by a first column select line (CSL(0)) 416a, and transistors 414c and 414d are controlled by a second column select line (CSL(1)) 416b. Transistors 414 couple the bit lines to corresponding sense amplifiers 418. Sense amplifiers 418a and 418b detect the bit values and provide the detected values to local I/O lines (LIO(0)) 420a and (LIO(1)) 420b, respectively. The values on local I/O lines 420a and 420b are coupled, through respective switches 422a and 422b, to corresponding global I/O lines (GIO(0)) 424a and (GIO(1)) 424b, and further to corresponding storage elements (S0) 426a and (S1) 426b. Global I/O lines 424 are also referred to as row data lines. Switches 422 are implemented with N-channel pass transistors in FIG. 4A. Control inputs of switches 422 are coupled to a column timing switch control circuit 430 that provides the column timing for a memory array configured with multiple segments. The memory segments are also referred to as memory banks.

In one aspect of the invention, the columns (i.e., the bit lines) of memory array 400 are designated to respective segments in a manner such that two columns within the same segment are not concurrently accessed. This arrangement allows for concurrent access of two data bits from two segments through two local I/O lines 420.

In another aspect of the invention, two data bits can be accessed from two different memory addresses within one clock cycle. The memory addresses can be provided by a source external to the memory device, or by an address generator within the memory device. In one implementation, one of the memory addresses is specified (i.e., either by an external or an internal source) and the other memory address is determined based on the specified memory address. For example, the first memory address can be specified as n, and the second memory address can be determined as n+1, n−1, or based on some other relationships.

In yet another aspect of the invention, segment (0) corresponding to local I/O line 420a includes even numbered bit lines, and segment (1) corresponding to local I/O line 420b includes odd numbered bit lines. This configuration allows concurrent access of a pair of odd numbered and even numbered data bits (e.g., data (n) and data (n+1)). However, the bit lines can be arranged in other ways, and these various arrangements are within the scope of the invention. These various aspects of the invention are further described in detail in the aforementioned related patent application Ser. No. 09/195,269.

In FIG. 4A, local I/O lines 420a and 420b are each shown as a single local I/O line. However, local I/O lines 420a and 420b can each represent a set of M local I/O lines that allows concurrent access of up to M data bits during a memory read or write operation. For example, each of local I/O lines 420a and 420b can be implemented as a set of four local I/O lines to allow concurrent access of four data bits from a memory segment.

Figure 4B:
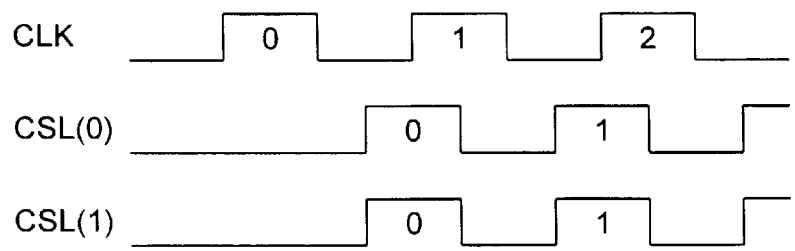
FIG. 4B shows a timing diagram for the architecture shown in FIG. 4A wherein the CSL signals have the same timing.

FIG. 4B shows a timing diagram for the architecture shown in FIG. 4A. As shown, the two CSLs have the same access timing derived from the clock signal (CLK). However, unlike FIG. 3B, the leading edges of the CSL signals are delayed to wait for the second data bit of each data bit pair during a write cycle.

Figure 5A:
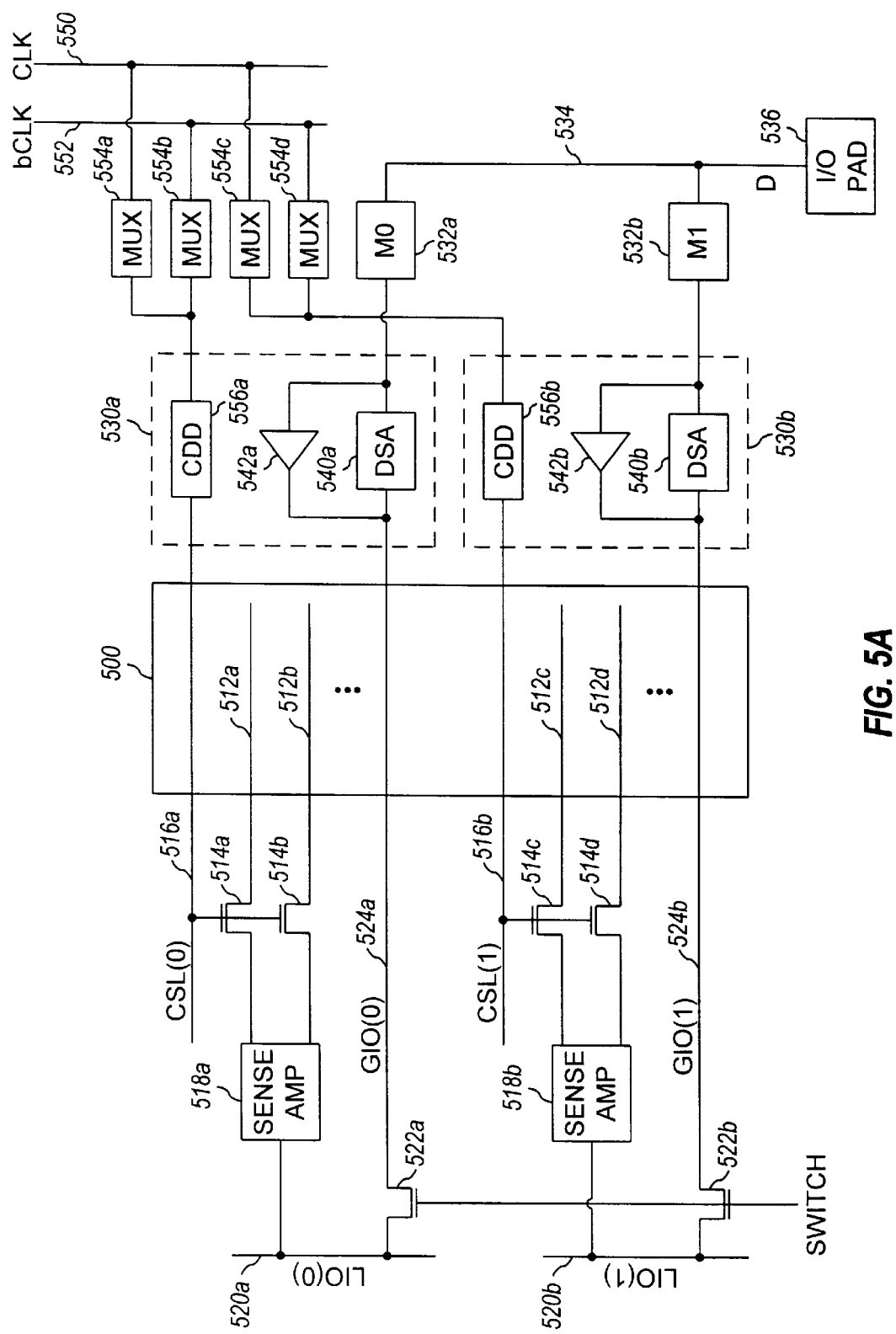
FIG. 5A shows an architecture wherein memory access of two data bits is enabled by two CSLs having different phases and using segmented local I/O lines.

FIG. 5A shows an architecture wherein memory access of two data bits is enabled by two CSLs operated at different phases and using segmented local I/O lines. Within a memory array 500, bit lines 512a through 512d couple to column select transfer transistors 514a through 514d, respectively. Transistors 514a and 514b are controlled by a first column select line (CSL(0)) 516a, and transistors 514c and 514d are controlled by a second column select line (CSL(1)) 516b. Transistors 514 couple the bit lines to corresponding sense amplifiers 518. Sense amplifiers 518a and 518b detect the bit values and provide the detected values to local I/O lines (LIO(0)) 520a and (LIO(1)) 520b, respectively. The values on local I/O lines 520a and 520b are coupled, through respective switches 522a and 522b, to corresponding global I/O lines (GIO(0)) 524a and (GIO(1)) 524b, and further to corresponding column control circuits 530a and 530b. Switches 522 are implemented with N-channel pass transistors in FIG. 5A.

Column control circuits 530a and 530b couple to respective multiplexers/demultiplexers (M0) 532a and (M1) 532b that further couple to an I/O pad 536 through a data line (D) 534. Column control circuits 530a and 530b also provide the timing signals for the CSLs (e.g., CSL(0) 516a and CSL(1) 516b).

FIG. 5A also shows an embodiment of column control circuit 530. Within column control circuit 530, global I/O line 524 couples to a data sense amplifier (DSA) 540 and a write driver 542. During a read operation, data sense amplifier 540 detects the value on global I/O line 524 and provides an output signal corresponding to the detected value. During a write operation, the input data is provided from I/O pad 536, through multiplexer 532, and to write driver 542. Write driver 542 buffers the data and provides the buffered data on global I/O line 524.

In the architecture shown in FIG. 5A, column control circuit 530 also includes circuitry to provide the signals for CSLs 516. A clock signal (CLK) 550 is coupled to multiplexers (MUXes) 554a and 554c. Similarly a complementary clock signal (bCLK) 552 is coupled to MUXes 554b and 554d. MUXes 554a and 554b couple to a column decoder driver (CDD) 556a, and MUXes 554c and 554d couple to a column decoder driver 556b. Column decoder drivers 556a and 556b couple to CSLs 516a and 516b, respectively.

Figure 5B:
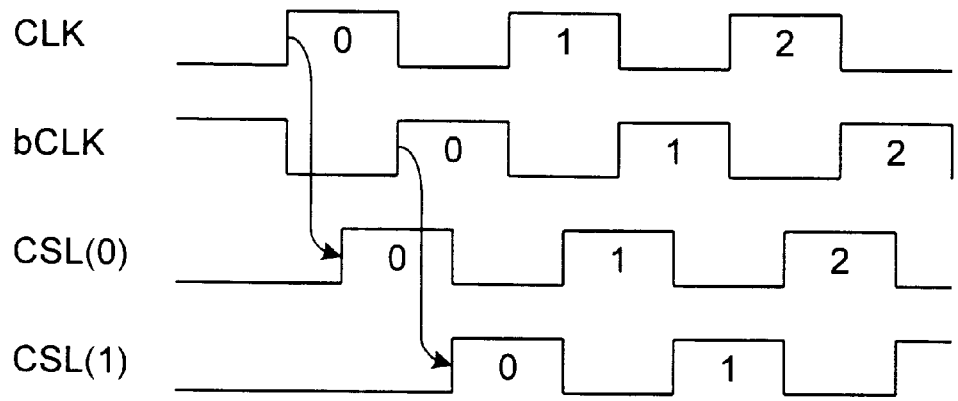
FIG. 5B shows a timing diagram illustrating the clock and CSL signals for the architecture shown in FIG. 5A.

FIG. 5B shows a timing diagram illustrating the clock and CSL signals for the architecture shown in FIG. 5A. As shown in FIG. 5B, CLK 550 and bCLK 552 are complementary signals (i.e., bCLK is delayed by half a clock cycle with respect to CLK). The CSL(0) signal is derived from CLK 550 and the CSL(1) signal is derived from bCLK 552. Thus, CSL(0) and CSL(1) are half a cycle apart with respect to each other (i.e., CSL(0) and CSL(1) are also complementary to each other).

Figure 5C:
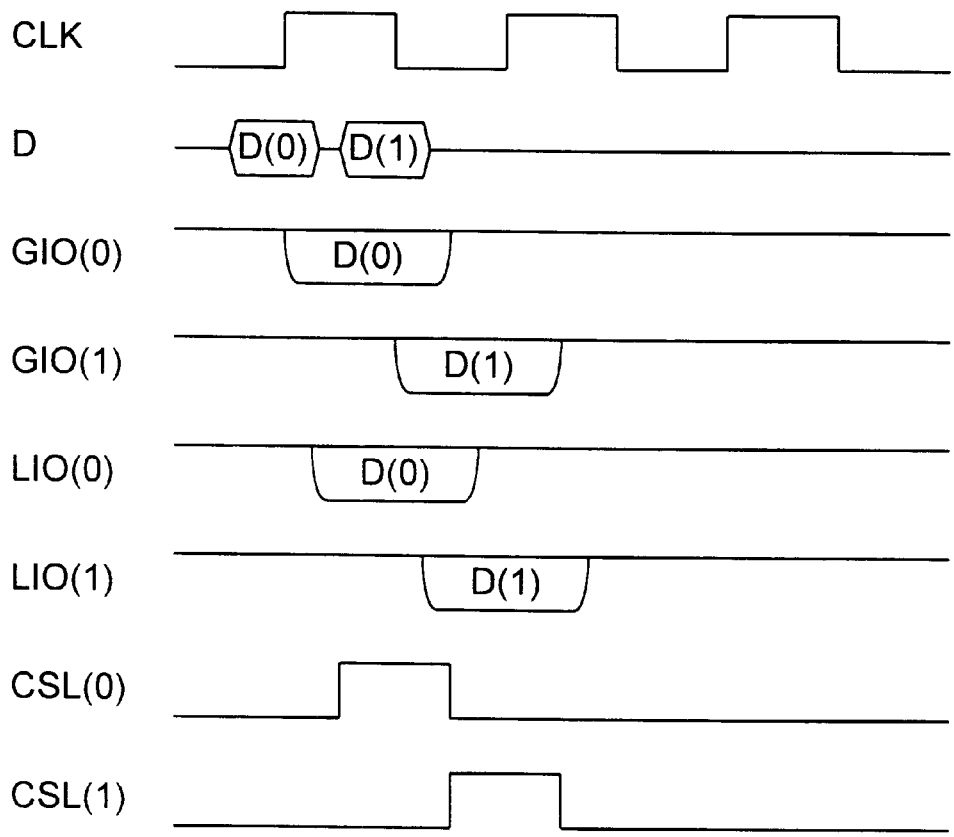
FIG. 5C shows a timing diagram for a write operation for the architecture shown in FIG. 5A.

FIG. 5C shows a timing diagram illustrating the signals during a write operation for the architecture shown in FIG. 5A. The data bit pair on data line 534 are demultiplexed, and the first data bit of each bit pair is provided to global I/O line (GIO(0)) 524a and the second data bit is provided to global I/O line (GIO(1)) 524b (see also, FIG. 5A). The data bits on GIO(0) 524a and GIO(1) 524b are provided, through switches 522a and 522b, to local I/O lines 520a and 520b, respectively. The values on local I/O lines 520a and 520b are then stored to memory array 500 at respective clock phases of CSL(0) and CSL(1).

Figure 5D:
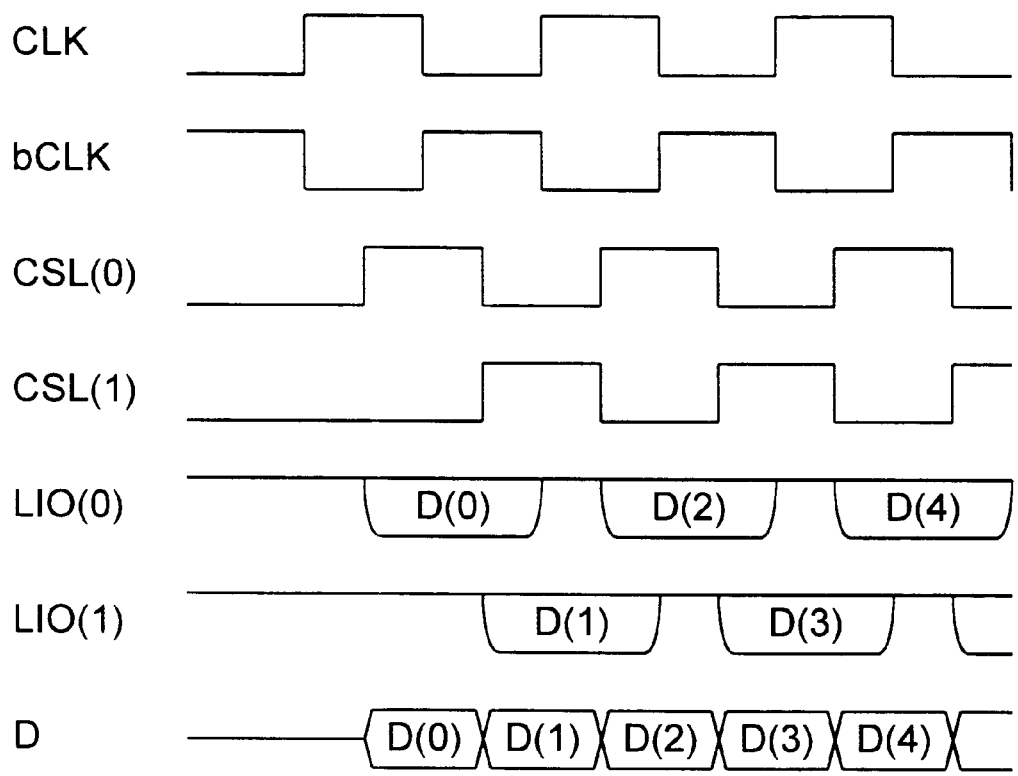
FIG. 5D shows a timing diagram for a read operation for the architecture shown in FIG. 5A.

FIG. 5D shows a timing diagram illustrating the signals during a read operation for the architecture shown in FIG. 5A. Two data bits are prefetched from memory array 500 half a clock cycle apart (i.e., corresponding to the clock phases of CSL(0) and CSL(1)). Because CSL(1) is delayed by half a clock cycle with respect to CSL(0), the data bit on local I/O line (LIO(1)) 520b is delayed by half a cycle with respect to the data bit on local I/O line (LIO(0)) 520a. The data bits are then provided to data line 534, as shown in FIG. 5D.

In the two CSLs architecture shown in FIG. 5A, the CSLs are fired with different timing. The first CSL fires off the rising edge of clock signal (CLK). The second CSL fires off a rising edge of the complementary clock signal (bCLK) (see FIG. 5B). Therefore, the write operation can start early on the first data bit of a data bit pair and is not dependent on the arrival of the second data bit (see FIG. 5C). Furthermore, the retrieved data during a read operation can be provided as it is prefetched from the memory array, and does not need to wait in the pipeline. This allows the CSL to have the same timing for both read and write operations, as shown in FIGS. 5C and 5D.

The architecture shown in FIG. 5A provides many benefits. During a read operation, data bits can be provided to the I/O pad as they are prefetched. For the architecture shown in FIG. 4A, prefetching is performed concurrently but the second data bit is stored for half a clock cycle before it is provided to the I/O pad. Thus, the architecture shown in FIG. 5A can reduce the memory access time by half a clock cycle, which can be significant for many applications. This improvement allows the memory access time of a memory device to be improved, for example, from 5.0 nsec down to 2.5 nsec.

Additionally, during a write operation, data bits are stored to the memory array as they are received on the I/O pad (without having to wait half a clock cycle, as for the architecture shown in FIG. 4A). This allows the write of the second data bit to be started and finished half a clock cycle earlier. Again, this is significant for some applications. For a memory device, this improvement provides design margin for some memory specifications such as, for example, the write-to-row timing specification.

Although some embodiments of the invention described above are specifically directed toward double data rate operation, the general inventive concept can be extended for concurrent memory access of any number of data bits. For example, the architectures shown above can easily be modified for a quadruple data rate operation, an octal data rate operation, or a P data rate operation (where P is any integer greater than one).

Furthermore, the various embodiments described above can be combined. For example, for a quadruple data rate operation, two CSLs may be used. In this case, two data bits share a common CSL. This example represents a combination of the architectures shown in FIGS. 2A plus either FIG. 4A or FIG. 5A.

The memory arrays described herein can be implemented within a stand-alone integrated circuit (IC) such as, for example, a DRAM IC. The memory arrays can also be implemented within other ICs, such as a processor, a controller, a digital signal processor, an application specific integrated circuit (ASIC), and others. The memory architectures described herein can be implemented on a memory array that is embedded within an integrated circuit such as, for example, a central processing unit (CPU).

The previous description of the specific embodiments is provided to enable any person skilled in the art to make or use the invention. The various modifications to these embodiments will be readily apparent to those skilled in the art, and the generic principles defined herein may be applied to other embodiments without the use of the inventive faculty. Thus, the invention is not intended to be limited to the embodiments shown herein but is to be accorded the widest scope consistent with the principles and novel features disclosed herein, and as defined by the following claims.

What is claimed is:

1. A memory device comprising:
   a memory array of memory cells operable to store data values;
   a plurality of (N) sensing circuits operatively coupled to N memory cells in the memory array, one sensing circuit coupled to each of the N memory cells;
   a plurality of (K) control lines, each control line associated with at least one sensing circuit; and
   an output circuit element operatively coupled to the N sensing circuits and configured to receive sensed data values, and
   wherein the K control lines are associated with K unique phases of a clock signal.

2. The memory device of claim 1 wherein N is two.

3. The memory device of claim 2 wherein K is two.

4. The memory device of claim 1, further comprising:
   a column decoder coupled to the K control lines and configured to receive at least one clock signal and generate signals for the K control lines in response to the at least one clock signal.

5. The memory device of claim 4, wherein the column decoder is configured to receive two clock signals.

6. The memory device of claim 1, further comprising:
   a plurality of (N) switches, one switch coupled between each sensing circuit and the output circuit element.

7. The memory device of claim 1, further comprising:
   a plurality of (N) local I/O lines, one local I/O line coupled between each sensing circuit and the output circuit element.

8. The memory device of claim 1 as implemented within a dynamic random access memory (DRAM) device.

9. The memory device of claim 1 as implemented within a synchronous graphics random access memory (SGRAM).

10. The memory device of claim 1 as implemented within an integrated circuit having an embedded memory array.

11. A memory device comprising:
    a memory array of memory cells operable to store data values;
    a plurality of (N) sensing circuits operatively coupled to N memory cells in the memory array, one sensing circuit coupled to each of the N memory cells;
    a plurality of (N) switches, one switch coupled to each of the N sensing circuits;
    a plurality of (K) control lines, each control line associated with at least one sensing circuit;
    an output circuit element operatively coupled to the N switches and configured to receive sensed data values; and
    a column timing switch control circuit coupled to the N switches, and
    wherein the K control lines are associated with K unique phases of a clock signal.

12. A method for accessing a plurality of data bits in a multi-data rate operation comprising:
    selecting a plurality of (N) memory cells to be accessed;
    activating a plurality of (K) control lines, wherein each control line is associated with a subset of the N memory cells;

sensing K subsets of memory cells in accordance with signals on the K control lines; and providing sensed data values to a receiving element, wherein the K control lines are associated with K unique phases of a clock signal.

13. The method of claim 12 wherein N is two.

14. The method of claim 12 wherein K is two.

15. The method of claim 12, further comprising:

receiving at least one clock signal; and generating signals for the K control lines in response to the at least one clock signal.

16. The method of claim 15 wherein two clock signals are received.

17. The method of claim 12, wherein the providing sensed data values comprises:

multiplexing the sensed data values to the receiving element.

18. The method of claim 12 wherein each sensed data value is provided to a corresponding local I/O line.

19. A method for writing data bits to a memory device in a multi-data rate operation, the method comprising:

selecting a plurality of (N) memory cells to be accessed;

receiving a plurality of (N) data values from a source element;

activating a plurality of (K) control lines; and writing to a respective subset of the N memory cells in accordance with each of the K control lines, and wherein the K control lines are associated with K unique phases of a clock signal.

20. A method for reading data bits from a memory device in a multi-data rate operation, the method comprising:

selecting a plurality of (N) memory cells to be accessed;

activating a plurality of (K) control lines;

sensing a respective subset of the N memory cells in accordance with each of the K control lines; and providing sensed data values to a receiving element, and wherein the K control lines are associated with K unique phases of a clock signal.

21. The memory device of claim 1, wherein the N memory cells have related addresses.

22. The memory device of claim 1, wherein the N memory cells have consecutively numbered addresses.

23. The memory device of claim 7, further comprising:

a plurality of (N) global I/O lines, one global I/O coupling between each respective local I/O line and the output circuit element.

24. The memory device of claim 1, further comprising:

a plurality of (N) control circuits coupled between the N sense amplifiers and the output circuit element, one control circuit for each of the N memory cells being accessed.

25. The memory device of claim 24, wherein each control circuit includes a data sense amplifier operative to detect a signal derived from one of the N memory cells and to provide an output signal corresponding to the detected signal.

26. The memory device of claim 25, wherein each control circuit further includes a write buffer operative to receive and buffer a data value received from the output circuit element.

27. The memory device of claim 1, wherein K is two, and wherein a first control line is associated with a rising edge of the clock signal and a second control line is associated with a falling edge of the clock signal.

28. The memory device of claim 1, wherein each control line is associated with one sensing circuit.

29. The memory device of claim 1, wherein the output circuit element is an I/O pad.

30. The memory device of claim 1, wherein the memory array is operative in a double data rate (DDR) mode.

31. The memory device of claim 1, wherein N sensed data values are provided to the output circuit element on one cycle of the clock signal.

32. The method of claim 12, wherein the N memory cells have related addresses.

33. The method of claim 12, wherein the N memory cells have consecutively numbered addresses.

34. The method of claim 12, further comprising:

prior to the providing, conditioning each signal sensed from the N memory cells.

35. The method of claim 12, wherein K is two, and wherein a first control line is associated with a rising edge of the clock signal and a second control line is associated with a falling edge of the clock signal.

36. The method of claim 12, wherein each control line is associated with one memory cell.

37. The method of claim 12, wherein the receiving element is an I/O pad.

38. The method of claim 12, wherein N sensed data values are provided to the receiving element on one cycle of the clock signal.

39. The method of claim 19, wherein K is two, and wherein a first control line is associated with a rising edge of the clock signal and a second control line is associated with a falling edge of the clock signal.

40. The method of claim 19, further comprising:

receiving and buffering the N data values received from the source element.

41. The method of claim 19, wherein the N data values are written to the memory device in one cycle of the clock signal.

* * * * *